US009411032B2

(12) United States Patent
Kabasawa et al.

(10) Patent No.: US 9,411,032 B2
(45) Date of Patent: Aug. 9, 2016

(54) SENSITIVITY DISTRIBUTION GENERATING APPARATUS, MAGNETIC RESONANCE SYSTEM, SENSITIVITY DISTRIBUTION GENERATING METHOD, AND PROGRAM

(75) Inventors: Hiroyuki Kabasawa, Tokyo (JP); Adrian Jeremy Knowles, Waukesha, WI (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 926 days.

(21) Appl. No.: 13/562,656

(22) Filed: Jul. 31, 2012

(65) Prior Publication Data

US 2014/0035575 A1 Feb. 6, 2014

(51) Int. Cl.
*G01R 33/48* (2006.01)
*G01R 33/24* (2006.01)

(52) U.S. Cl.
CPC .............. *G01R 33/48* (2013.01); *G01R 33/246* (2013.01); *G01R 33/4828* (2013.01)

(58) Field of Classification Search
CPC ... G01R 33/48; G01R 33/246; G01R 33/4828
See application file for complete search history.

(56) References Cited

U.S. PATENT DOCUMENTS 7,015,696 B2 3/2006 Kabasawa
7,446,527 B2 11/2008 Kabasawa
7,592,810 B2 * 9/2009 Reeder et al. ................. 324/309
7,664,541 B2 2/2010 Wang et al.
7,701,211 B2 4/2010 Katscher et al.
7,741,842 B2 * 6/2010 McKenzie et al. ............ 324/307
7,888,936 B2 * 2/2011 Jellus ........................... 324/309
7,956,611 B2 6/2011 Nakai
8,278,924 B2 * 10/2012 Fuderer ......................... 324/307
8,384,383 B2 * 2/2013 Frahm et al. .................. 324/309
2008/0231273 A1 9/2008 Kabasawa

OTHER PUBLICATIONS

C. Wurslin, ISMRM 2010, p. 5051: An A-Priori Supported Image Correction Method for Severe Intensity Non-Uniformities At 3T, 1 page.

* cited by examiner

*Primary Examiner* — Dixomara Vargas

(57) ABSTRACT

A sensitivity distribution generating apparatus configured to generate sensitivity distribution data of a coil for receiving magnetic resonance signals from an imaging region including a first substance and a second substance different in resonant frequency is provided. The sensitivity distribution generating apparatus includes a reference image data generating unit configured to generate reference image data in which a region of the first substance is suppressed and a region of the second substance is emphasized, based on data obtained by executing a separation sequence for separating the first substance and the second substance from each other, and an estimating unit configured to estimate a sensitivity of the coil in the region of the first substance, based on a signal value of the region of the second substance in the reference image data.

8 Claims, 9 Drawing Sheets

REFERENCE SCAN A

IMAGING SCAN B

SENSITIVITY DISTRIBUTION GENERATING APPARATUS, MAGNETIC RESONANCE SYSTEM, SENSITIVITY DISTRIBUTION GENERATING METHOD, AND PROGRAM

BACKGROUND OF THE INVENTION

The present invention relates to a sensitivity distribution generating apparatus, a magnetic resonance system, a sensitivity distribution generating method, and a program for generating sensitivity distribution data of a coil.

There has heretofore been known a method for generating sensitivity distribution of a coil. For example, see ISMRM 2010, p. 5051: AN A-PRIORI SUPPORTED IMAGE CORRECTION METHOD FOR SEVERE INTENSITY NON-UNIFORMITIES AT 3T.

Further, there has been also known a method for segmenting an imaging region into respective tissues on the basis of the signal strength of the image data of the imaging region to generate sensitivity distribution data by using the segmentation data. However, in this method, the segmentation of respective tissues is difficult when the difference in signal strength between different tissues is small. This makes the reliability of the sensitivity distribution reduced. It has thus been desired to obtain sensitivity distribution data with high reliability.

BRIEF DESCRIPTION OF THE INVENTION

In a first aspect, a sensitivity distribution generating apparatus which generates sensitivity distribution data of a coil for receiving magnetic resonance signals from an imaging region including a first substance and a second substance different in resonant frequency is provided. The apparatus includes a reference image data generating unit that generates reference image data in which a region of the first substance is suppressed and a region of the second substance is emphasized, based on data obtained by executing a separation sequence for separating the first substance and the second substance from each other, and an estimating unit which estimates a sensitivity of the coil in the region of the first substance, based on a signal value of the region of the second substance in the reference image data In a second aspect, a magnetic resonance system which scans an imaging region including a first substance and a second substance different in resonant is provided. The system includes a scan unit which executes a separation sequence for separating the first and second substances included in the imaging region, a reference image data generating unit which generates reference image data in which a region of the first substance is suppressed and a region of the second substance is emphasized, based on data obtained by executing the separation sequence and an estimating unit which estimates a sensitivity of a coil in the region of the first substance, based on a signal value of the region of the second substance in the reference image data.

In a third aspect, a sensitivity distribution generating method which generates sensitivity distribution data of a coil for receiving magnetic resonance signals from an imaging region including a first substance and a second substance different in resonant frequency is provided. The method includes generating reference image data in which a region of the first substance is suppressed and a region of the second substance is emphasized, based on data obtained by executing a separation sequence for separating the first substance and the second substance included in the imaging region from each other, and estimating a sensitivity of the coil in the region of the first substance, based on a signal value of the region of the second substance in the reference image data.

In a fourth aspect, a program for generating sensitivity distribution data of a coil for receiving magnetic resonance signals from an imaging region including a first region and a second region different in resonant frequency is provided. The program causes a computer to execute a reference image data generating process which generates reference image data in which a region of the first substance is suppressed and a region of the second substance is emphasized, based on data obtained by executing a separation sequence for separating the first substance and the second substance included in the imaging region from each other, and an estimating process which estimates a sensitivity of the coil in the region of the first substance, based on a signal value of the region of the second substance in the reference image data.

In the reference image data, a region of a first substance is suppressed and a region of a second substance is emphasized. The reference image data is generated based on data obtained by executing a separation sequence for separating the first substance and the second substance different in resonant frequency. It is thus possible to separate the first and second substances from each other with sufficient accuracy.

DETAILED DESCRIPTION OF THE INVENTION

Exemplary embodiments will hereinafter be described. The present invention is however not limited to the exemplary embodiments specifically described herein.

Figure 1:
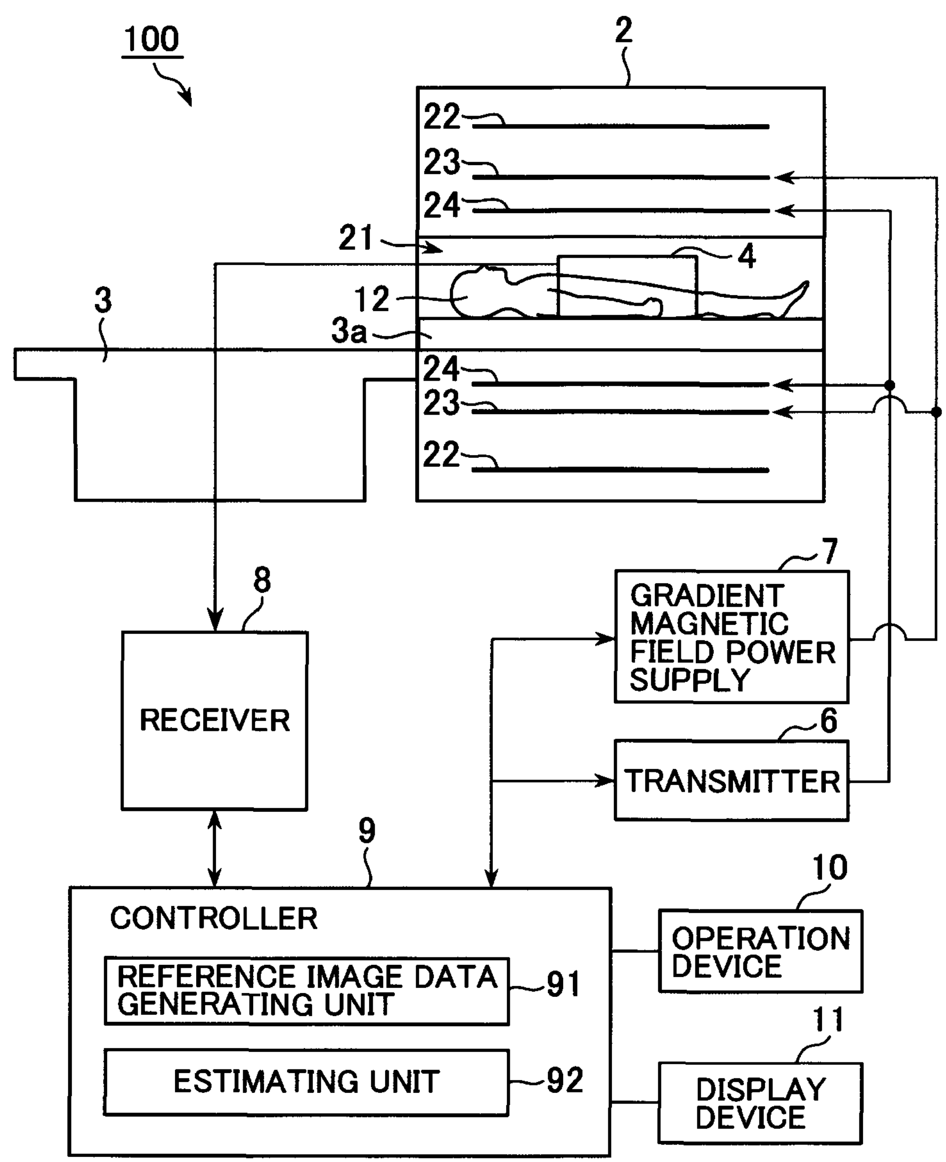
FIG. 1 is a schematic diagram of a magnetic resonance system according to one embodiment.

FIG. 1 is a schematic diagram of a magnetic resonance system according to one embodiment.

The magnetic resonance system (hereinafter called "MR system" and MR: Magnetic Resonance) 100 has a magnet 2, a table 3, a receiving coil 4, etc.

The magnet 2 has a bore 21 in which a subject 12 is accommodated, a superconductive coil 22, a gradient coil 23, a RF coil 24, etc. The superconductive coil 22 applies a static magnetic field, the gradient coil 23 applies a gradient magnetic field, and the RF coil 24 transmits an RF pulse. Incidentally, a permanent magnet may be used instead of the superconductive coil 22.

The table 3 has a cradle 3*a* for supporting the subject 12. With the movement of the cradle 3*a* into the bore 21, the subject 12 is carried in the bore.

The receiving coil 4 is attached to an abdominal region of the subject 12.

The MR system 100 further includes a transmitter 6, a gradient magnetic field power supply 7, a receiver 8, a controller 9, an operation device 10 and a display device 11, etc.

The transmitter 6 supplies a current to the RF coil 24.

The gradient magnetic field power supply 7 supplies a current to the gradient coil 23.

The receiver 8 receives a RF signal from the receiving coil 4 to perform signal processing (for example, demodulation) of the RF signal.

The controller 9 controls the operations of respective parts of the MR system 100 so as to realize various operations of the MR system 100 such as transmission of information necessary for the display device 11, reconstruction of an image based on data received from the receiver 8, etc.

The controller 9 has a reference image data generating unit 91 and an estimating unit 92, etc.

The reference image data generating unit 91 generates reference image data in which each water region is suppressed and a fat region is emphasized, based on data obtained by executing a water-fat separation sequence for separating water and fat from each other.

The estimating unit 92 estimates the sensitivity of the coil in the water region, based on a signal value of the fat region in the reference image data.

The controller 9 is one example that configures the reference image data generating unit 91 and the estimating unit 92. The controller 9 executes a predetermined program to function as these units. Incidentally, the controller 9 is one example of a sensitivity distribution generating apparatus.

The operation device 10 is operated by an operator and inputs various information to the controller 9. The display device 11 displays various information thereon.

The MR system 100 is configured as described above.

Figures 2, 3:
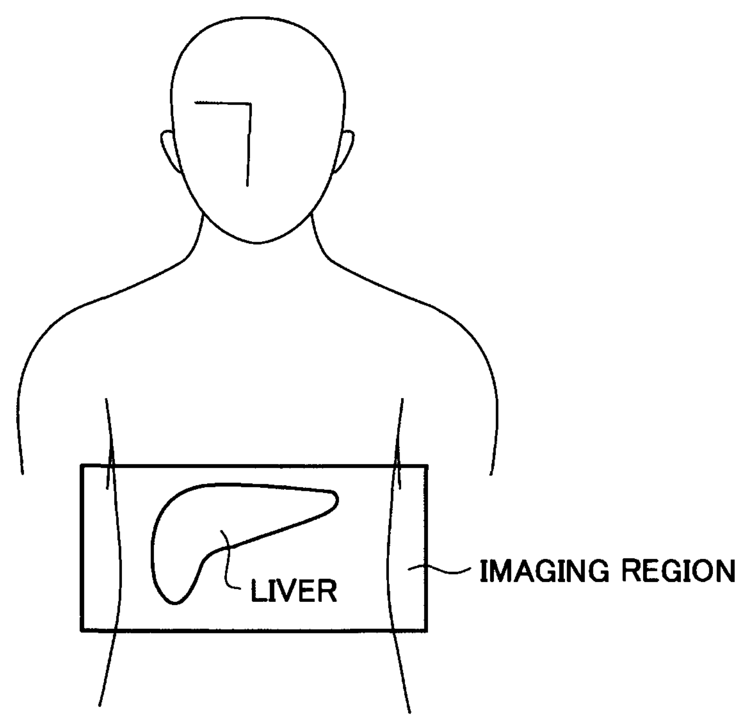
FIG. 2 is a diagram for describing a sequence used when an imaging region of a subject 12 is imaged.
FIG. 3 is a diagram schematically showing the imaging region of the subject 12.

FIG. 2 is a diagram for describing a sequence used when an imaging region of the subject 12 is imaged, and FIG. 3 is a diagram schematically showing an example of the imaging region of the subject 12. In the present embodiment, the imaging region R includes the liver.

In the present embodiment, a reference scan A and an imaging scan B are carried out.

In the reference and imaging scans A and B, a water-fat separation sequence is executed. The water-fat separation sequence is a sequence for separating water and fat from each other using the difference in resonant frequency between the water and the fat in the imaging region R to acquire water image data and fat image data.

In the present embodiment, sensitivity distribution data is generated based on data obtained by the reference scan A. The generated sensitivity distribution data is used to correct water image data and fat image data obtained by the imaging scan B. A procedure for generating the sensitivity distribution data will be explained below.

Figure 4:
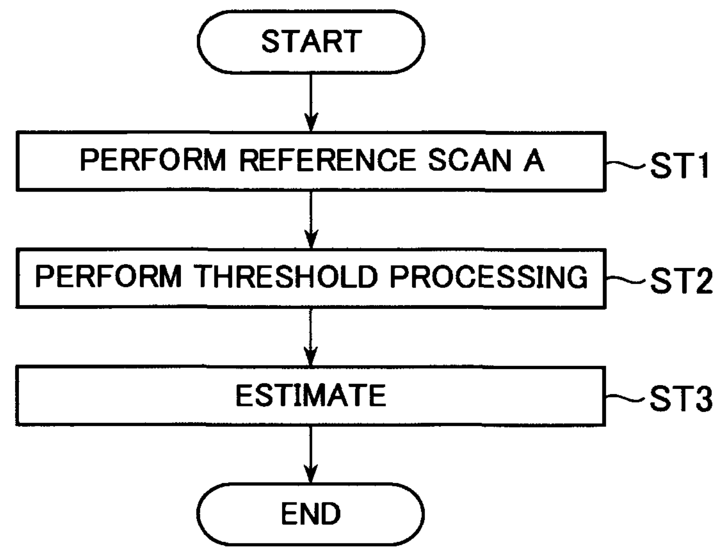
FIG. 4 is a flow showing a procedure for generating sensitivity distribution data.

FIG. 4 is a flow showing the procedure of generating the sensitivity distribution data.

At Step ST1, the water-fat separation sequence in the reference scan A is performed. Then, the reference image data generating unit 91 (refer to FIG. 1) generates fat image data, based on data acquired by carrying out the water-fat separation sequence in the reference scan A. Fat image data $D_{fat}$ in an axial section is schematically shown in FIG. 5.

Figure 5:
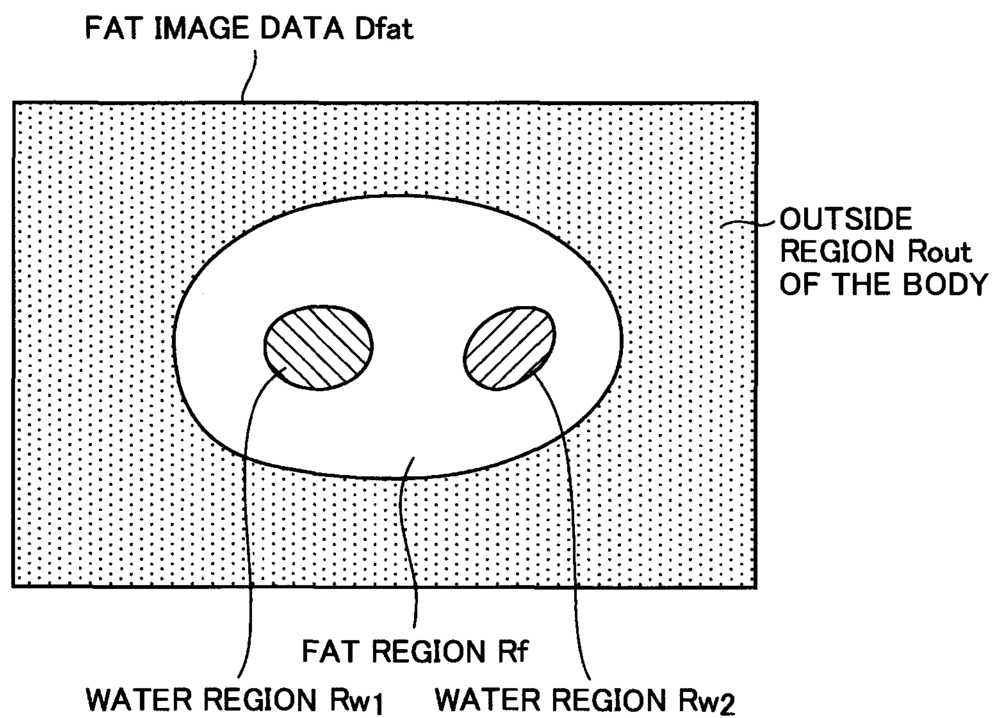
FIG. 5 is a diagram schematically illustrating fat image data $D_{fat}$ in an axial section.

In FIG. 5, a body region in the fat image data $D_{fat}$ is shown by one fat region $R_f$ and two water regions $R_{w1}$ and $R_{w2}$ for convenience of explanation. The fat region $R_f$ is represented by a high signal, whereas the water regions $R_{w1}$ and $R_{w2}$ are represented by a low signal. Incidentally, in FIG. 5, an outside region $R_{out}$ of the body is expressed in dots for convenience of explanation. After the generation of the fat image data $D_{fat}$, the flow proceeds to Step ST2.

At Step ST2, the reference image data generating unit 91 performs threshold processing for removing noise (signals of the outside region $R_{out}$ of the body, etc.) on the fat image data $D_{fat}$ (refer to FIG. 6).

Figure 6A:
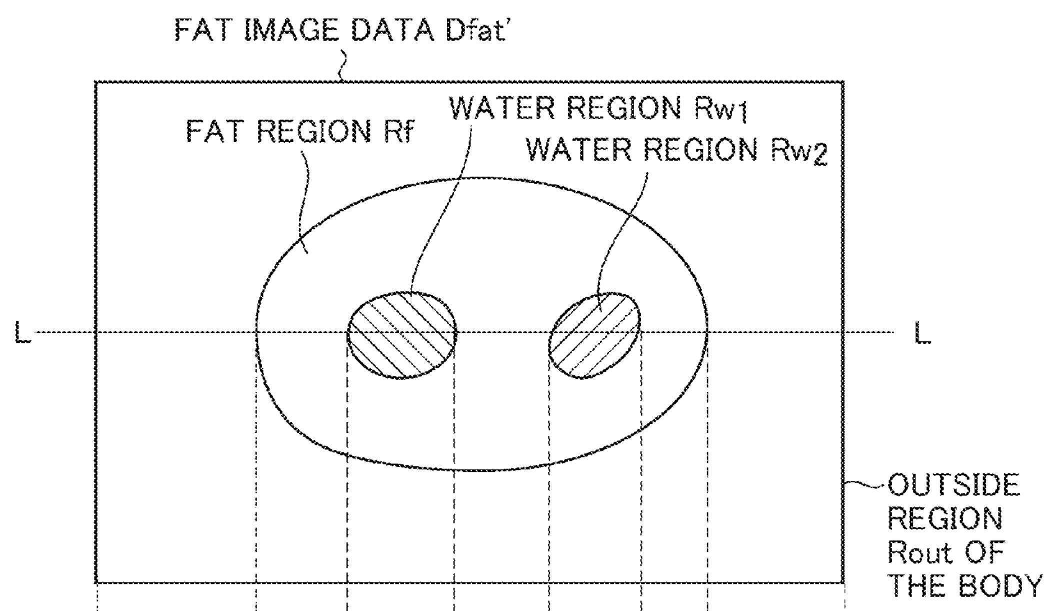
FIGS. 6A and 6B are diagrams for describing fat image data after being subjected to threshold processing.
Figure 6B:
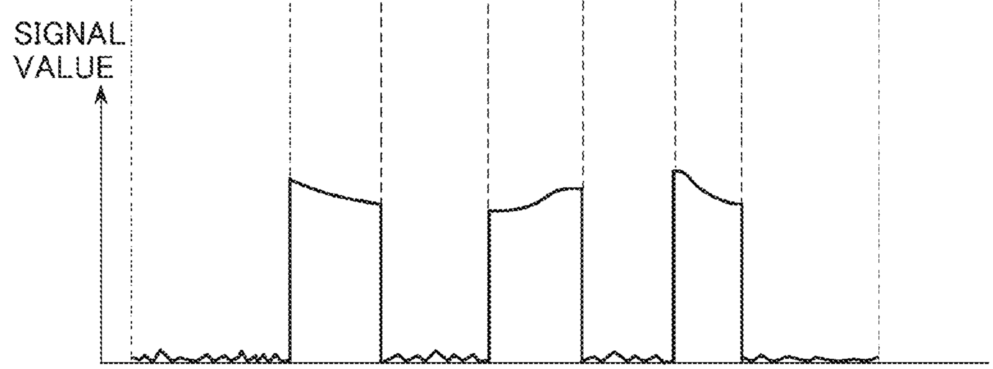

FIGS. 6A and 6B are diagrams for describing fat image data after being subjected to the threshold processing.

FIG. 6A is a diagram schematically showing fat image data $D_{fat}'$ after being subjected to the threshold processing, and FIG. 6B is a sectional diagram taken along line L-L of FIG. 6A.

In the present embodiment, the fat image data $D_{fat}'$ after being subjected to the threshold processing is used as reference image data for generating sensitivity distribution data. Since the fat region $R_f$ is represented by a high signal as shown in FIG. 6B, a signal value of the fat region $R_f$ can be used as data on a sensitivity distribution. However, signal values of the water regions $R_{w1}$ and $R_{w2}$ cannot be used as data on a coil's sensitivity distribution because the water regions $R_{w1}$ and $R_{w2}$ are represented by low signals. Thus, in the present embodiment, the sensitivities of the water regions $R_{w1}$ and $R_{w2}$ represented by the low signal are estimated using the signal value of the fat region $R_f$ represented by the high signal. The flow proceeds to Step ST3 to estimate the sensitivities.

At Step ST3, the estimating unit 92 (refer to FIG. 1) estimates the sensitivities of the water regions $R_{w1}$ and $R_{w2}$.

Figure 7A:
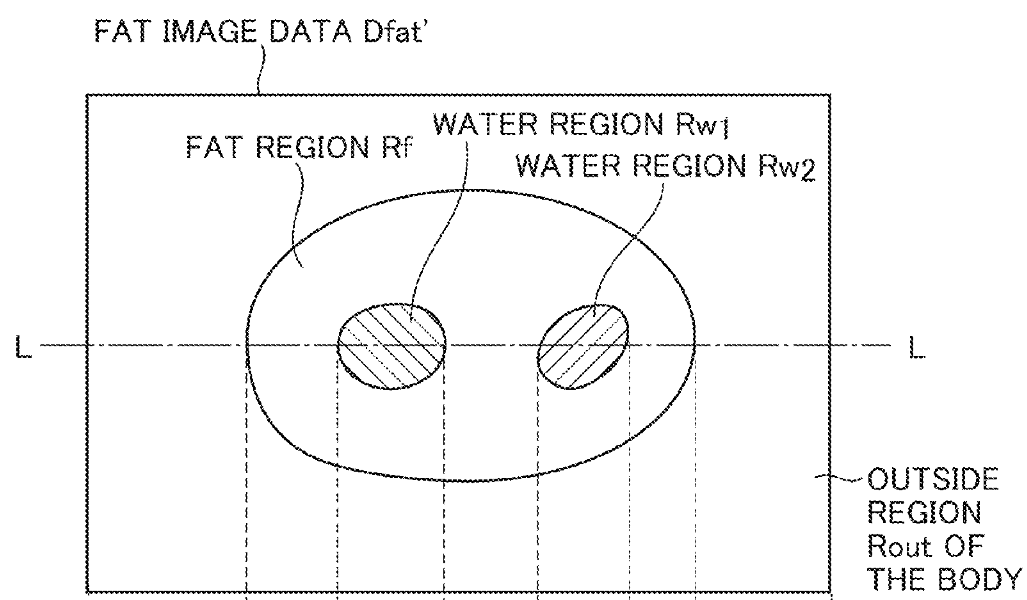
FIGS. 7A and 7B are diagrams for describing one example of a method for estimating sensitivity.
Figure 7B:
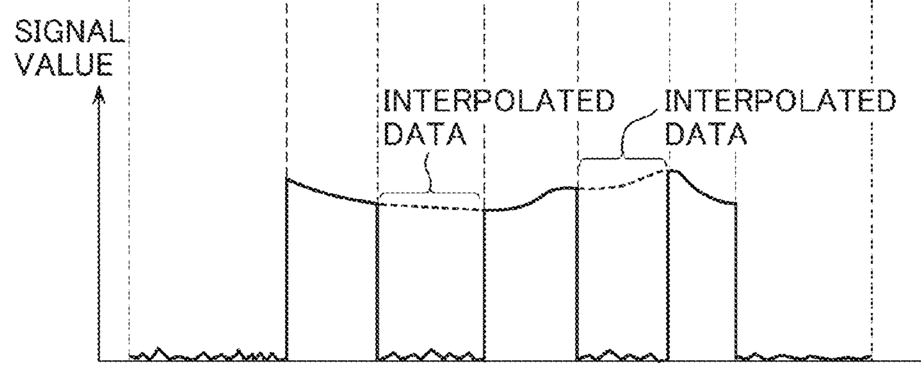

FIGS. 7A and 7B are diagrams for describing one example of a method for estimating the sensitivity.

Figure 8A:
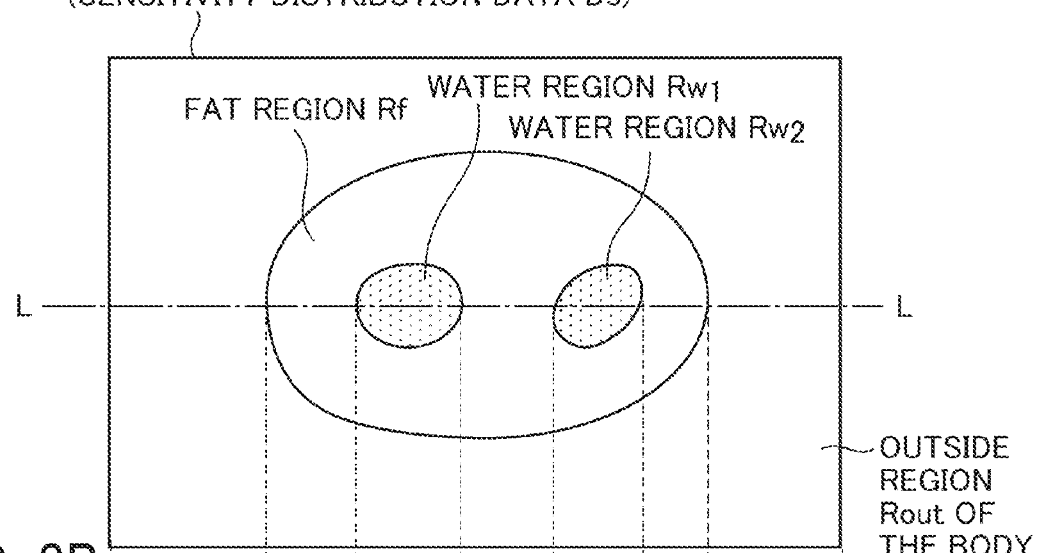
FIGS. 8A and 8B are diagrams schematically showing fat image data $D_{fat}''$ after the sensitivities of water regions $R_{w1}$ and $R_{w2}$ have been estimated.
Figure 8B:
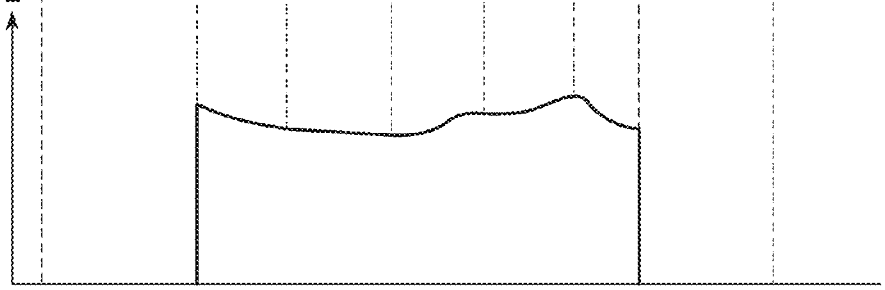

When, for example, the sensitivity of the water region $R_{w1}$ is estimated, data of the water region $R_{w1}$ is interpolated using a signal value of fat that exists around the water region $R_{w1}$. As interpolation methods therefor, there can be used various interpolation methods such as a cubic spline method, etc. Interpolating the data of the water region $R_{w1}$ enables estimation of a sensitivity distribution of the water region $R_{w1}$. The sensitivity of another water region $R_{w2}$ is also estimated by interpolating data of the water region $R_{w2}$ using a signal value of fat that exists around the water region $R_{w2}$. FIGS. 8A and 8B schematically show fat image data $D_{fat}''$ where the sensitivities of the water regions $R_{w1}$ and $R_{w2}$ have been estimated. The fat image data $D_{fat}''$ obtained in this way is used as coil's sensitivity distribution data $D_s$. The sensitivity distribution data $D_s$ of the coil is data used to correct the water image data and fat image data obtained by the imaging scan B.

The sensitivity distribution data $D_s$ of the coil is obtained in the above-described manner.

In the present embodiment, the image data is obtained using the water-fat separation sequence. Thus, water and fat can be separated with high accuracy, this makes it possible to obtain highly reliable sensitivity distribution data.

In the present embodiment, the sensitivity distribution data has been generated using the fat image data $D_{fat}$ acquired during the reference scan A. Since the difference in the contrast of fat between organs is generally not so large, sensitivity distribution data with higher reliability can be obtained using the fat image data $D_{fat}$.

Incidentally, sensitivity distribution data may be generated using water image data instead of the fat image data $D_{fat}$. The water image data is image data in which a fat region is suppressed and each water region is emphasized. Thus, when the sensitivity distribution data is determined using the water image data, the sensitivity of the fat region may be estimated based on the signal value of each water region. It is however desirable that a filtering process is performed after the sensitivity of the fat region is estimated since the contrast of water tends to depend on the type of organ. The filtering process makes it possible to obtain sensitivity distribution data with high reliability.

In the present embodiment, the fat image data $D_{fat}$ is threshold-processed at Step ST2. If it is however possible to obtain highly reliable sensitivity distribution data, then there is no need to perform the threshold processing.

Incidentally, when the imaging region has a high iron content, a water-fat separation sequence considering $T_2$*effects may be used as the water-fat separation sequence for the reference scan A. Considering the $T_2$*effects enables an improvement in accuracy when the water and fat are separated from each other.

The present embodiment has explained the example in which the sensitivity distribution data is generated using the water-fat separation sequence. However, sensitivity distribution data may be generated using another separation sequence for separating substances different in resonant frequency, instead of the water-fat separation sequence. For example, a sequence for separating water and silicon from each other may be performed to generate sensitivity distribution data, based on water image data or silicon image data. Further, a sequence for separating fat and silicon from each other may be carried out to generate sensitivity distribution data, based on fat image data or silicon image data.

Figure 9:
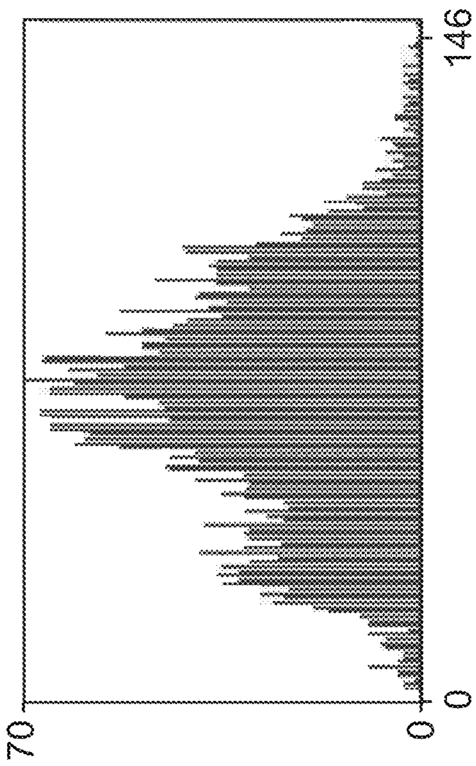
FIG. 9 shows an example of MR image A obtained by a water-fat separation sequence, and a Histogram H of the MR image A.
Figure 9:
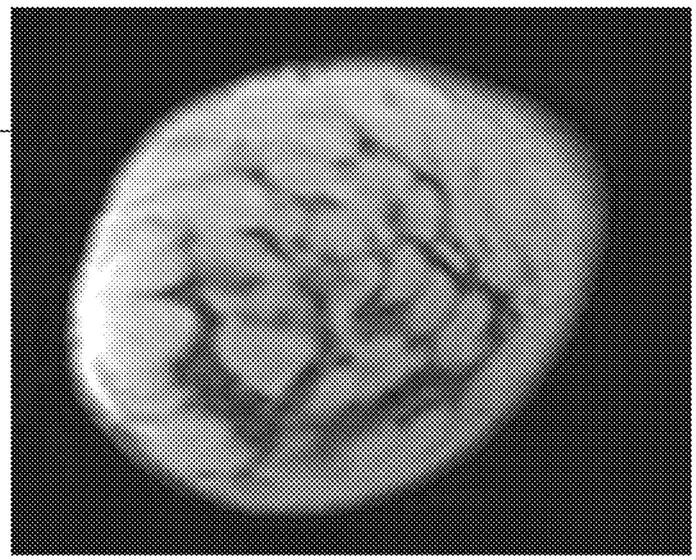
Figure 10:
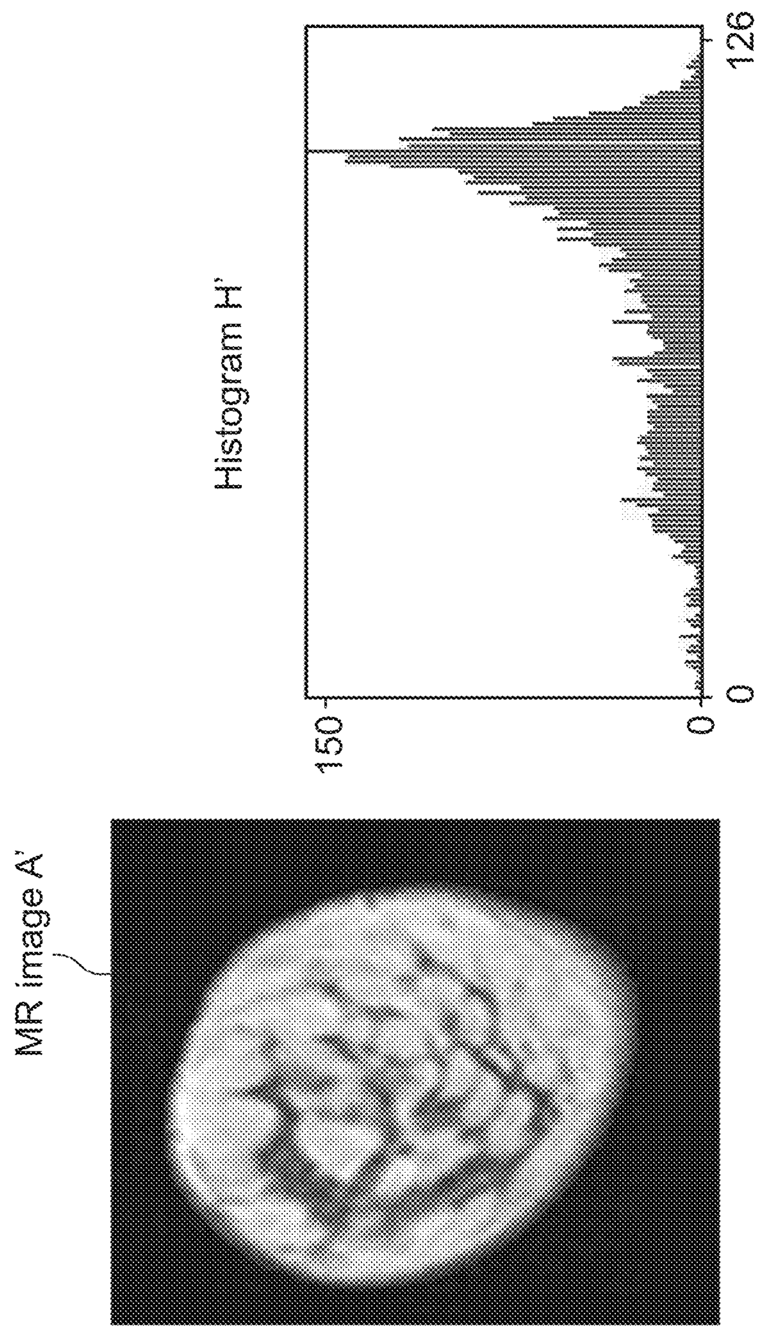
FIG. 10 shows an example of MR image A' obtained by correcting the sensitivity of the MR image A, and a Histogram H' of the MR image A'.

FIG. 9 shows an example of MR image A obtained by a water-fat separation sequence, and a Histogram H of the MR image A. FIG. 10 shows an example of MR image A' obtained by correcting the sensitivity of the MR image A, and a Histogram H' of the MR image A'. Compared with FIG. 9 and FIG. 10, it can be seen that the non-uniformity of the sensitivity is improved by the correction.

The invention claimed is:

1. A sensitivity distribution generating apparatus configured to generate sensitivity distribution data of a coil for receiving magnetic resonance signals from an imaging region of a subject including fat and water regions, said sensitivity distribution generating apparatus comprising:

an image data generating unit configured to generate fat image data in which a water region is suppressed and a fat region is emphasized, based on image data obtained by executing a separation sequence for separating the fat and water regions from each other; and an estimating unit configured to estimate a sensitivity of the coil based on the fat image data;

wherein the estimating unit uses a signal value of the fat region of the fat image data as data representing a coil sensitivity of the fat region; and wherein the estimating unit interpolates data of the water region using the signal value of the fat region of the fat image data, and estimates the data obtained by the interpolation as data representing a coil sensitivity of the water region.

2. The sensitivity distribution generating apparatus according to claim 1, wherein the image data generating unit is configured to generate fat image data in which the water region is suppressed and the fat region is emphasized, based on the image data obtained by executing the separation sequence, and configured to generate the fat image data by eliminating noise from the image data.

3. The sensitivity distribution generating apparatus according to claim 2, wherein the estimating unit is configured to estimate a coil sensitivity of the water region, based on the signal value of the fat region that exists around the water region.

4. The sensitivity distribution generating apparatus according to claim 1, wherein the estimating unit is configured to estimate a coil sensitivity of the water regio, based on the signal value of the fat region that exists around the water region.

5. A magnetic resonance imaging system configured to scan an imaging region of a subject including fat and water regions, said magnetic resonance imaging system comprising:

a scan unit configured to execute a separation sequence for separating the fat and water regions included in the imaging region;

an image data generating unit configured to generate fat image data in which a water region is suppressed and a fat region is emphasized, based on image data obtained by executing the separation sequence; and an estimating unit configured to estimate a sensitivity of a coil, based on the fat image data;

wherein the estimating unit uses a signal value of the fat region of the fat image data as data representing a coil sensitivity of the fat region; and wherein the estimating unit interpolates data of the water region using the signal value of the fat region of the fat image data, and estimates the data obtained by the interpolation as data representing a coil sensitivity of the water region.

6. The magnetic resonance imaging system according to claim 5, wherein the image data generating unit is configured to generate fat image data in which the water region is suppressed and the fat region is emphasized, based on the image data obtained by executing the separation sequence, and configured to generate the fat image data by eliminating noise from the image data.

7. The magnetic resonance imaging system according to claim 6, wherein the estimating unit is configured to estimate a coil sensitivity of the water region, based on the signal value of the fat region that exists around the water region.

8. The magnetic resonance imaging system according to claim 5, wherein the estimating unit is configured to estimate a coil sensitivity of the water region, based on the signal value of the fat region that exists around the water region.

* * * * *